(12) United States Patent
Ishida et al.

(10) Patent No.: US 8,081,460 B2
(45) Date of Patent: Dec. 20, 2011

(54) LIQUID-COOLED HEAT RADIATOR

(75) Inventors: Tomotaka Ishida, Tokyo (JP); Mitsuru Yamamoto, Tokyo (JP); Sakae Kitajo, Tokyo (JP); Kazuhiro Kumakura, Oyama (JP)

(73) Assignees: NEC Corporation, Tokyo (JP); Showa Denko K.K., Tokyo (JP)

( * ) Notice: Subject to any disclaimer, the term of this patent is extended or adjusted under 35 U.S.C. 154(b) by 560 days.

(21) Appl. No.: 12/087,879

(22) PCT Filed: Jan. 23, 2007

(86) PCT No.: PCT/JP2007/050941
§ 371 (c)(1),
(2), (4) Date: Jul. 16, 2008

(87) PCT Pub. No.: WO2007/086353
PCT Pub. Date: Aug. 2, 2007

(65) Prior Publication Data
US 2010/0155035 A1    Jun. 24, 2010

(30) Foreign Application Priority Data
Jan. 24, 2006    (JP) .................................. 2006-014629

(51) Int. Cl.
*H05K 7/20*    (2006.01)
(52) U.S. Cl. ... 361/700; 361/688; 361/699; 165/104.33; 257/707
(58) Field of Classification Search ............. 361/679.52, 361/679.53, 688–690, 696–700, 707, 718–719, 361/728
See application file for complete search history.

(56) References Cited

U.S. PATENT DOCUMENTS
4,941,530 A * 7/1990 Crowe ..................... 165/104.33
(Continued)

FOREIGN PATENT DOCUMENTS
CN    2452052 Y    10/2001
(Continued)

OTHER PUBLICATIONS
Office Action Dated Aug. 3, 2010, issued on the corresponding Chinese Patent Application No. 200780003313.0 and English translation thereof.

(Continued)

*Primary Examiner* — Courtney Smith
(74) *Attorney, Agent, or Firm* — Edwards Angell Palmer & Dodge LLP (57) ABSTRACT

A liquid-cooled heat radiator 1 includes a heat radiation base 2 having a cooling-liquid channel 5, and an expansion tank 7 provided on the heat radiation base 2. The expansion tank 7 has a tank body 26 having an expanded portion 27, which expands upward and opens downward, and a bottom plate 28 joined to the lower end of the tank body 26 to thereby close a bottom opening of the expanded portion 27. A through-hole 29 is formed in the top wall of the expanded portion 27 of the tank body 26 and serves as a communication section for establishing communication between the interior and the exterior of the cooling-liquid channel 5. A hydrogen-permeable member 31 is fixedly fitted into the through-hole 29 so as to stop the through-hole 29. The hydrogen-permeable member 31 satisfies the relation $B \geq 50 A$, where A and B are water-vapor permeability and hydrogen permeability, respectively, of the hydrogen-permeable member 31. The hydrogen-permeable member 31 is formed from a single material selected from the group consisting of ethylene-propylene rubber, butyl rubber, fluorine-containing rubber, nitrile-butadiene rubber, and silicone rubber. The liquid-cooled heat radiator 1 can be free from an increase in pressure in the cooling-liquid channel 5.

19 Claims, 7 Drawing Sheets

U.S. PATENT DOCUMENTS

| | | | |
|---|---|---|---|
| 5,316,077 A * | 5/1994 | Reichard | 165/104.28 |
| 6,301,097 B1 * | 10/2001 | Ellsworth et al. | 361/728 |
| 6,661,658 B2 * | 12/2003 | Capriz et al. | 361/690 |
| 7,417,857 B2 * | 8/2008 | Rondier et al. | 361/699 |
| 7,486,518 B2 * | 2/2009 | Tomioka | 361/718 |
| 2008/0202730 A1 * | 8/2008 | Onishi et al. | 165/104.28 |
| 2009/0050301 A1 * | 2/2009 | Ishida et al. | 165/104.33 |
| 2010/0039767 A1 * | 2/2010 | Katada et al. | 361/679.53 |

FOREIGN PATENT DOCUMENTS

| | | |
|---|---|---|
| CN | 2645248 Y | 9/2004 |
| JP | 05-213295 | 8/1993 |
| JP | 11-118311 | 4/1999 |
| JP | 2001-244395 | 9/2001 |
| JP | 2002-168575 | 6/2002 |
| JP | 2003-007944 | 1/2003 |
| JP | 2003-171656 | 6/2003 |
| JP | 2004-190928 | 7/2004 |
| JP | 2005-167224 | 6/2005 |

OTHER PUBLICATIONS

International Search Report mailed Mar. 20, 2007, issued on PCT/JP2007/050941.

* cited by examiner

LIQUID-COOLED HEAT RADIATOR

TECHNICAL FIELD

The present invention relates to a liquid-cooled heat radiator for radiating heat generated from a heat-generating body, such as a heat-generating electronic component of a piece of electronic equipment, such as a notebook-size personal computer, a two-dimensional display unit, or a projector.

The term "aluminum" as used herein and in the appended claims encompasses aluminum alloys in addition to pure aluminum. Also, herein and in the appended claims, the upper and lower sides of FIGS. 2 to 6 will be referred to as "upper" and "lower," respectively.

BACKGROUND ART

A conventionally widely employed method for radiating heat generated from a heat-generating electronic component of electronic equipment uses an aluminum heat radiation substrate whose one side serves as a heat-receiving surface to be thermally brought in contact with the heat-generating electronic component and which has heat radiation fins provided integrally with the other side thereof. The heat-generating electronic component is mounted on the heat-receiving surface of the heat radiation substrate. Wind is blown against the heat radiation fins by means of a cooling fan, thereby releasing heat generated from the heat-generating electronic component into the air via the heat radiation substrate and the heat radiation fins.

However, because of a tendency of an increased amount of heat generated from heat-generating electronic components used in recent electronic equipment associated with implementation of reduced sizes and higher performance, the conventional method has been encountering difficulty in providing sufficient heat radiation performance. Also, notebook-size personal computers, two-dimensional display units, projectors, and the like have been increasing in noise of cooling fans and thus have been encountering difficulty in fulfilling required quietness.

In order to solve the above problems, the applicants of the present invention proposed a liquid-cooled heat radiator which uses a water-containing cooling liquid; for example, antifreeze (refer to Patent Document 1). The liquid-cooled heat radiator described in Patent Document 1 includes a heat radiation base composed of two aluminum plates brazed together in layers and having a cooling-liquid channel; an expansion tank provided on the heat radiation base; and a pump for circulating antifreeze through the cooling-liquid channel. The heat radiation base has, on its one side, a heat-receiving region with which a heat-generating body to be cooled by the cooling liquid flowing through the cooling-liquid channel is thermally brought in contact. The cooling-liquid channel is formed by outwardly expanding at least one of the two aluminum plates. The expansion tank has a tank body having an expanded portion, which expands upward and opens downward, and a bottom plate joined to the lower end of the tank body to thereby close a bottom opening of the expanded portion, and joined to the upper surface of the heat radiation base. The heat radiation base and the bottom plate have respective communication holes formed therein for establishing communication between the cooling-liquid channel and the interior of the tank body.

Meanwhile, the antifreeze is noncorrosive to aluminum, but may generate hydrogen through reaction between water and aluminum. So long as the amount of generated hydrogen is small, generated hydrogen is collected within the tank body of the expansion tank, thereby preventing increase in pressure in the cooling-liquid channel. However, because of the limitation of the effect of preventing increase in pressure in the cooling-liquid channel by means of the expansion tank, an increase in the amount of generated hydrogen may cause the pressure in the cooling-water channel to exceed an allowable pressure, potentially causing a malfunction of the pump.

Patent Document 1: Japanese Patent Application Laid-Open (kokai) No. 2005-167224

DISCLOSURE OF THE INVENTION

Problems to be Solved by the Invention

An object of the present invention is to solve the above-mentioned problems and to provide a liquid-cooled heat radiator which can be free from an increase in pressure in a cooling-liquid channel.

Means for Solving the Problems

To fulfill the above object, the present invention comprises the following modes.

1) A liquid-cooled heat radiator comprising a heat radiation base having a cooling-liquid channel, wherein the heat radiation base has a communication section for establishing communication between the interior and the exterior of the cooling-liquid channel, and a hydrogen-permeable member is disposed in the communication section.

2) A liquid-cooled heat radiator according to par. 1), wherein the hydrogen-permeable member satisfies a relation $B \geqq 50A$, where A is water-vapor permeability of the hydrogen-permeable member, and B is hydrogen permeability of the hydrogen-permeable member.

3) A liquid-cooled heat radiator according to par. 1), wherein the hydrogen-permeable member is formed from a single material selected from the group consisting of ethylene-propylene rubber, butyl rubber, fluorine-containing rubber, nitrile-butadiene rubber, and silicone rubber.

4) A liquid-cooled heat radiator according to par. 1), wherein the dimension of the hydrogen-permeable member along a hydrogen permeation direction and the area of a section of the hydrogen-permeable member taken perpendicular to the hydrogen permeation direction are determined such that a hydrogen permeation speed of the hydrogen-permeable member is 0.1 cc/h or higher per an inner surface area of 1 mm$^2$ of the cooling-liquid channel.

5) A liquid-cooled heat radiator according to par. 1), wherein an expansion tank is provided on the heat radiation base; the expansion tank has a tank body having an expanded portion, which expands upward and opens downward, and a bottom plate joined to a lower end of the tank body to thereby close a bottom opening of the expanded portion, and joined to an upper surface of the heat radiation base; the heat radiation base and the bottom plate have respective communication holes formed therein for establishing communication between the cooling-liquid channel and the interior of the tank body; the communication section is a through-hole formed in a top wall of the expanded portion of the tank body; and the hydrogen-permeable member is fixedly fitted into the through-hole so as to stop the through-hole.

6) A liquid-cooled heat radiator according to par. 5), wherein the hydrogen-permeable member assumes the form of a pin, and the hydrogen-permeable member has an outward flange formed integrally with an outer end portion of the hydrogen-permeable member and adapted to be in close contact with an outer surface of the top wall of the tank body.

7) A liquid-cooled heat radiator according to par. 5) or 6), wherein an inner end portion of the hydrogen-permeable member projects into the interior of the tank body, and the hydrogen-permeable member has an engagement portion formed integrally with the inner end portion of the hydrogen-permeable member projecting into the interior of the tank body, and adapted to be engaged with a peripheral region around the through-hole of an inner surface of the top wall of the tank body.

8) A liquid-cooled heat radiator according to par. 1), wherein the heat radiation base is composed of two metal plates joined together in layers, and the cooling-liquid channel is formed between the two metal plates used to form the heat radiation base.

9) A liquid-cooled heat radiator according to par. 8), wherein the metal plates are aluminum plates and are brazed together in layers.

10) A liquid-cooled heat radiator according to par. 9), wherein the two aluminum plates are brazed together by utilization of a brazing material layer formed on at least one of the two aluminum plates on a side which faces the other aluminum plate.

11) A liquid-cooled heat radiator according to par. 8), wherein the cooling-liquid channel includes a channel formation section formed by outwardly expanding at least one of the two metal plates; the channel formation section includes a disconnected portion where the channel formation section is locally disconnected; two end portions of the channel formation section which terminate at the disconnected portion are formed by expanding one of the two metal plates with the other metal plate maintaining its outer surface flat; the other metal plate has two communication holes formed therein for allowing the two terminal portions terminating at the disconnected portion of the channel formation section to communicate with the exterior of the two terminal portions through the two communication holes, respectively; a communication member for establishing communication between the two communication holes is fixed to an outer surface of the other metal plate by means of joint members; the communication member includes a body which expands outward and opens toward the one of the two metal plates to thereby form an opening, and an outward flange formed integrally with a peripheral portion around the opening of the body; a region between the outward flange and an outer surface of the other metal plate serves as the communication section; and the hydrogen-permeable member in the form of a sheet is disposed in the communication section.

12) A liquid-cooled heat radiator according to par. 8), wherein the cooling-liquid channel includes a channel formation section formed by outwardly expanding at least one of the two metal plates; the channel formation section includes a disconnected portion where the channel formation section is locally disconnected; two end portions of the channel formation section which terminate at the disconnected portion are formed by expanding one of the two metal plates with the other metal plate maintaining its outer surface flat; the other metal plate has two communication holes formed therein for allowing the two terminal portions terminating at the disconnected portion of the channel formation section to communicate with the exterior of the two terminal portions through the two communication holes, respectively; a communication member for establishing communication between the two communication holes is fixed to an outer surface of the other metal plate by means of joint members; the communication member includes a body which expands outward and opens toward the one of the two metal plates to thereby form an opening, and an outward flange formed integrally with a peripheral portion around the opening of the body; a region between the outward flange and an outer surface of the other metal plate serves as the communication section; and the hydrogen-permeable member in the form of an O-ring is disposed in the communication section.

13) A liquid-cooled heat radiator according to par. 11) or 12), wherein a through-hole is formed in a top wall of the body of the communication member; the through-hole also serves as the communication section; and the hydrogen-permeable member is fixedly fitted into the through-hole so as to stop the through-hole.

14) A liquid-cooled heat radiator according to par. 1), wherein a pump for circulating a cooling liquid through the cooling-liquid channel is mounted on the heat radiation base.

15) A liquid-cooled heat radiator according to par. 8), wherein the cooling-liquid channel includes a channel formation section formed by outwardly expanding at least one of the two metal plates; the channel formation section includes a disconnected portion where the channel formation section is locally disconnected; two end portions of the channel formation section which terminate at the disconnected portion are formed by expanding one of the two metal plates with the other metal plate maintaining its outer surface flat; the other metal plate has two through-holes formed therein for allowing the two terminal portions terminating at the disconnected portion of the channel formation section to communicate with the exterior of the two terminal portions through the two through-holes, respectively; a pump having a discharge port and a suction port and adapted to circulate a cooling liquid through the cooling-liquid channel is mounted on an outer surface of the other metal plate; the discharge port of the pump is connected to one of the two through-holes formed in the other metal plate, and the suction port of the pump is connected to the other through-hole; a region between the pump and the outer surface of the other metal plate serves as the communication section; and the hydrogen-permeable member in the form of a sheet is disposed in the communication section.

16) A liquid-cooled heat radiator according to par. 8), wherein the cooling-liquid channel includes a channel formation section formed by outwardly expanding at least one of the two metal plates; the channel formation section includes a disconnected portion where the channel formation section is locally disconnected; two end portions of the channel formation section which terminate at the disconnected portion are formed by expanding one of the two metal plates with the other metal plate maintaining its outer surface flat; the other metal plate has two through-holes formed therein for allowing the two terminal portions terminating at the disconnected portion of the channel formation section to communicate with the exterior of the two terminal portions through the two through-holes, respectively; a pump having a discharge port and a suction port and adapted to circulate a cooling liquid through the cooling-liquid channel is mounted on an outer surface of the other metal plate; the discharge port of the pump is connected to one of the two through-holes formed in the other metal plate, and the suction port of the pump is connected to the other through-hole; a region between the pump and the outer surface of the other metal plate serves as the communication section; and the hydrogen-permeable member in the form of an O-ring is disposed around each of the discharge port and the suction port in the communication section.

17) A liquid-cooled heat radiator according to par. 1), wherein the heat radiation base has, on its one side, a heat-receiving region with which a heat-generating element is thermally brought in contact.

18) A piece of electronic equipment comprising a housing and a heat-generating electronic component disposed within the housing, wherein the liquid-cooled heat radiator according to par. 17) is disposed within the housing, and the heat-generating electronic component is thermally brought in contact with the heat-receiving region of the heat radiation base.

19) A notebook-size personal computer comprising a body section having a keyboard, and a display unit which is provided on the body section such that it can be opened and closed, wherein the liquid-cooled heat radiator according to par. 17) is disposed within a housing of the body section, and a CPU disposed within the housing of the body section is thermally brought in contact with the heat-receiving region of the heat radiation base.

Effects of the Invention

According to the liquid-cooled heat radiator of par. 1), in the case where the heat radiation base is formed from, for example, aluminum or a like metal, even when hydrogen gas is generated from reaction of the metal with water contained in the cooling liquid which is sealed in the cooling-liquid channel, the hydrogen gas permeates through the hydrogen-permeable member and is released to the exterior of the cooling-liquid channel, thereby preventing increase in pressure in the cooling-liquid channel. This prevents the occurrence of a malfunction of the pump for circulating the cooling liquid. In the case where the expansion tank is provided, the expansion tank can have a minimum size required for absorption of a thermal expansion of the cooling liquid.

According to the liquid-cooled heat radiator of par. 2) or 3), while hydrogen generated in the cooling-liquid channel is effectively released to the exterior of the cooling-liquid channel, leakage of water vapor generated in association with heating of the cooling liquid can be prevented, thereby preventing reduction in the amount of the cooling liquid.

According to the liquid-cooled heat radiator of par. 4), hydrogen generated in the cooling-liquid channel can be efficiently released to the exterior of the cooling-liquid channel.

According to the liquid-cooled heat radiator of par. 5), the provision of the communication section for establishing communication between the interior and the exterior of the cooling-liquid channel can be implemented relatively easily, as can the disposition of the hydrogen-permeable member in the communication section. Further, since the communication section assumes the form of the through-hole formed in the top wall of the expanded portion of the tank body, and the hydrogen-permeable member is fixedly fitted into the through-hole so as to stop the through-hole, in an ordinary state of use of the liquid-cooled heat radiator; i.e., in a state where the expansion tank is oriented in such a manner as to project upward, the hydrogen-permeable member is in contact with a gaseous-phase region. Thus, hydrogen easily permeates through the hydrogen-permeable member, whereas water vapor encounters difficulty in permeating therethrough.

The liquid-cooled heat radiator of par. 6) facilitates the determination of the amount of fit in fitting the hydrogen-permeable member into the through-hole formed in the top wall of the tank body.

The liquid-cooled heat radiator of par. 7) can be free from detachment of the hydrogen-permeable member from the through-hole formed in the top wall of the tank body.

The liquid-cooled heat radiator of par. 8) or 9) exhibits excellent efficiency of heat radiation from the heat radiation base.

The liquid-cooled heat radiator of par. 10) enables relatively easy manufacture of the heat radiation base.

According to the liquid-cooled heat radiator of par. 11) or 12), the provision of the communication section for establishing communication between the interior and the exterior of the cooling-liquid channel can be implemented relatively easily, as can the disposition of the hydrogen-permeable member in the communication section. Also, the body of the communication member functions as an expansion tank.

According to the liquid-cooled heat radiator of par. 13), in the liquid-cooled heat radiator of par. 11) or 12), the through-hole is formed in the top wall of the body of the communication member and also serves as the communication section, and the hydrogen-permeable member is fixedly fitted into the through-hole so as to stop the through-hole. Thus, in an ordinary state of use of the liquid-cooled heat radiator; i.e., in a state where the communication member is oriented in such a manner as to project upward, the hydrogen-permeable member, which stops the through-hole, is in contact with a gaseous-phase region. Thus, hydrogen easily permeates through the hydrogen-permeable member, whereas water vapor encounters difficulty in permeating therethrough. By contrast, in the case where the liquid-cooled heat radiator is inverted to be brought in a state reverse to the ordinary state of use, the sheet-like hydrogen-permeable member disposed in the communication section located between the outward flange and the outer surface of the other metal plate is in contact with the gaseous-phase region. Thus, hydrogen easily permeates through the sheet-like hydrogen-permeable member, whereas water vapor encounters difficulty in permeating therethrough.

Even when the pump for circulating the cooling liquid through the cooling-liquid channel is provided as in the case of the liquid-cooled heat radiator of par. 14), the configuration of any one of pars. 1) to 13) prevents increase in pressure in the cooling-liquid channel, thereby preventing the occurrence of a malfunction of the pump.

According to the liquid-cooled heat radiator of par. 15) or 16), the provision of the communication section for establishing communication between the interior and the exterior of the cooling-liquid channel can be implemented relatively easily, as can the disposition of the hydrogen-permeable member in the communication section.

The electronic equipment of par. 18) enjoys efficient cooling of the heat-generating electronic component and improved quietness.

The notebook-size personal computer of par. 19) enjoys efficient cooling of the CPU and improved quietness.

BEST MODE FOR CARRYING OUT THE INVENTION

Embodiments of the present invention will next be described with reference to the drawings. In the drawings, like features or components are denoted by like reference numerals, and repeated description thereof is omitted.

Figure 1:
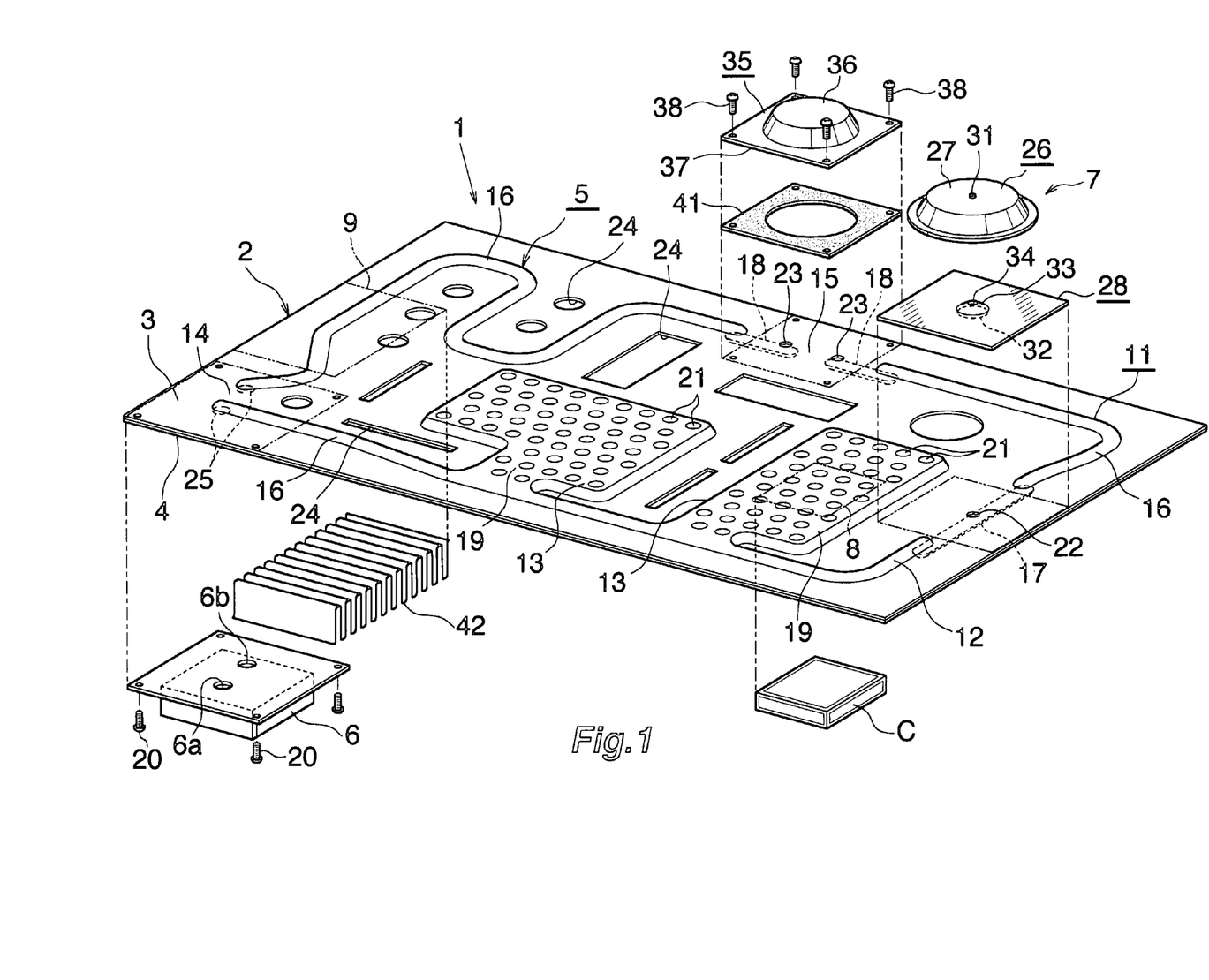
[FIG. 1] Exploded perspective view showing the overall configuration of a first embodiment of a liquid-cooled heat radiator according to the present invention.
Figure 2:
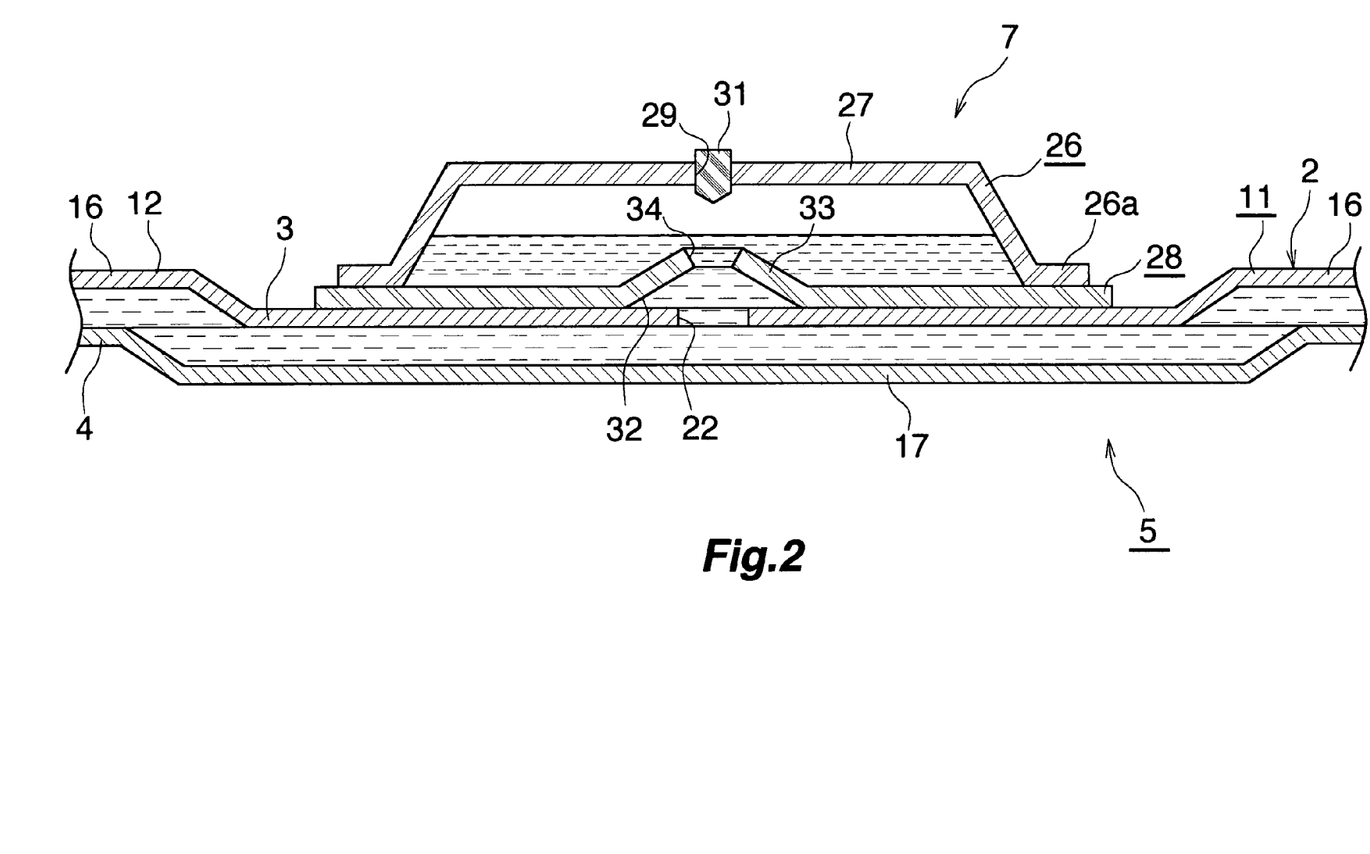
[FIG. 2] Enlarged vertical sectional view showing a portion of the liquid-cooled heat radiator of FIG. 1 where an expansion tank is provided.
Figure 3:
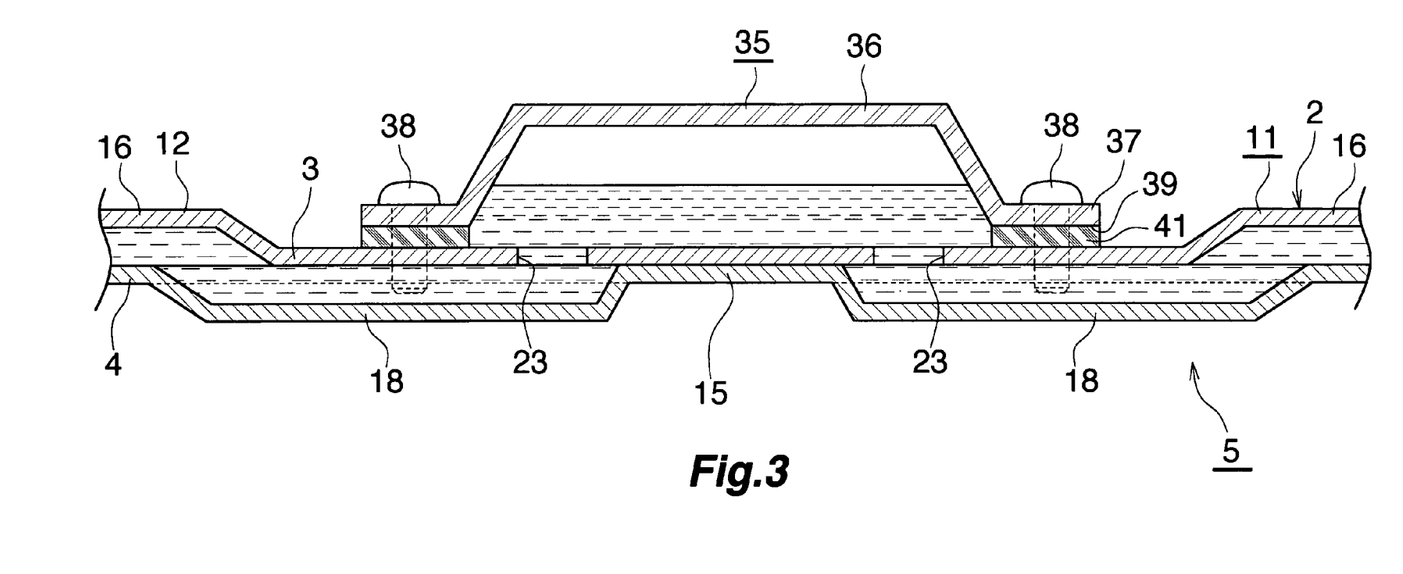
[FIG. 3] Enlarged vertical sectional view showing a portion of the liquid-cooled heat radiator of FIG. 1 where a communication member is provided.

FIG. 1 shows the overall configuration of a first embodiment of a liquid-cooled heat radiator according to the present invention. FIGS. 2 and 3 show the structure of essential portions of the first embodiment.

In FIG. 1, a liquid-cooled heat radiator 1 includes a heat radiation base 2 assuming the form of a rectangular plate and formed from two, upper and lower, highly heat-conductive plates; herein, metal plates 3, 4 of aluminum, joined together in layers. A cooling-liquid channel 5 is formed between the two metal plates 3, 4 of the heat radiation base 2.

A cooling liquid, such as antifreeze, which is noncorrosive to aluminum, but contains water, is sealed in the cooling-liquid channel 5 of the heat radiation base 2. The cooling liquid contained in the cooling-liquid channel 5 is circulated through the cooling-liquid channel 5 by means of a circulation pump 6 mounted on the lower surface of the heat radiation base 2. An expansion tank 7 is provided on the upper surface of the heat radiation base 2 in such a manner as to communicate with the interior of the cooling-liquid channel 5. A heat-receiving region 8 and a heat-radiating region 9 are provided on the lower surface of the heat radiation base 2 in such a manner as to include a portion of the cooling-liquid channel 5.

At least one of the two metal plates 3, 4 used to form the heat radiation base 2 is an aluminum brazing sheet having a brazing material layer on a side which faces the other metal plate. The two metal plates 3, 4 are brazed together by utilization of the brazing material layer of the aluminum brazing sheet. In the case where only one of the two metal plates is an aluminum brazing sheet, the other metal plate is of an aluminum bare material.

The cooling-liquid channel 5 of the heat radiation base 2 includes a channel formation section 11, which is formed by outwardly expanding at least one of the upper and lower metal plates 3, 4. The channel formation section 11 includes a first subsection 12, which is formed along substantially the entire periphery of the heat radiation base 2, and a predetermined number of; herein, two, second subsections 13, which extend inward over a predetermined area from a portion of the first subsection 12 which extends along one long side of the heat radiation base 2. The first subsection 12 is locally disconnected at a portion along one corer of the heat radiation base 2 and at a portion along the other long side of the heat radiation base 2, thereby forming disconnected portions 14, 15, respectively. The disconnected portion along the one corner of the heat radiation base 2 is called the first disconnected portion 14. The disconnected portion along the other long side of the heat radiation base 2 is called the second disconnected portion 15. The first subsection 12 includes upwardly expanded portions 16, which are formed by upwardly expanding the upper metal plate 3, and downwardly expanded portions 17, 18, which are formed by downwardly expanding the lower metal plate 4. The upwardly expanded portions 16 and the lower metal plate 4 as well as the downwardly expanded portions 17, 18 and the upper metal plate 3 form the first subsection 12 of the communication formation section 11. The downwardly expanded portion 17 is formed at a portion of the first subsection 12 which extends along one short side of the heat radiation base 2, whereas the downwardly expanded portions 18 are formed at two end portions of the first subsection 12 which terminate at the second disconnected portion 15. The downwardly expanded portion formed at a portion of the first subsection 12 which extends along the short side of the heat radiation base 2 is called the first downwardly expanded portion 17, whereas the downwardly expanded portions formed at the two end portions of the first subsection 12 which terminate at the second disconnected portion 15 are called the second downwardly expanded portions 18. A lower surface of the heat radiation base 2 which includes the first disconnected portion 14 and has a predetermined area, and an upper surface of the heat radiation base 2 which includes the second disconnected portion 15 and has a predetermined area are flat. The upwardly expanded portions 16 and the lower metal plate 4 form the first subsection 12, except for portions of the first subsection 12 which are formed by the downwardly expanded portions 17, 18 and the upper metal plate 3. Each of the second subsections 13 is formed by the lower metal plate 4 and an upwardly expanded portion 19, which is formed by upwardly expanding the upper metal plate 3. A large number of projections 21 are formed on the top wall of the upwardly expanded portion 19 such that the projections 21 project inward and such that end portions of the projections 21 are brazed to the lower metal plate 4.

The upper metal plate 3 has a communication hole 22 through which a longitudinally intermediate portion of the first downwardly expanded portion 17 of the first subsection 12 of the channel formation section 11 opens at the upper side of the heat radiation base 2, and two communication holes 23 through which end portions, which are located on a side toward the second disconnected portion 15, of the second downwardly expanded portions 18 of the first subsection 12 of the channel formation section 11 open at the upper side of the heat radiation base 2. The upper metal plate 3 also has a plurality of through-holes 24 formed therein in such a manner as to avoid interfering with the channel formation section 11. The lower metal plate 4 has through-holes 25 through which end portions, which terminate at the first disconnected portion 14, of the upwardly expanded portions 16 of the first subsection 12 of the channel formation section 11 open at the lower side of the heat radiation base 2.

The circulation pump 6 is mounted, by means of screws 20, on the lower surface of the heat radiation base 2 at a corner portion where the first disconnected portion 14 is present. A discharge port 6a of the circulation pump 6 is connected to one of the two through-holes 25 of the lower metal plate 4, whereas a suction port 6b is connected to the other through-hole 25 of the lower metal plate 4. An appropriate seal means intervene between the upper surface of the circulation pump 6 and the lower surface of the heat radiation base 2 so as to provide a seal against the surfaces.

The expansion tank 7 includes an aluminum tank body 26 having an expanded portion 27, which expands upward and opens downward, and an aluminum bottom plate 28 adapted to close the lower end opening of the tank body 26.

As shown in FIG. 2, the tank body 26 is formed by upwardly expanding a circular aluminum brazing sheet having a brazing material layer on its lower side, except for a peripheral portion of the sheet. The expanded portion 27 of the tank body 26 assumes the form of a truncated cone such that its circumferential wall inclines radially inward with respect to the upward direction. A through-hole 29 is formed in a central portion of the top wall of the expanded portion 27 and serves as a communication section for establishing communication between the interior and the exterior of the cooling-liquid channel 5. A hydrogen-permeable member 31 in the form of a pin is fixedly fitted into the through-hole 29. The hydrogen-permeable member 31 seals the through-hole 29. An outer end portion of the hydrogen-permeable member 31 projects outward from the top wall, and an inner end portion of the hydrogen-permeable member 31 projects inward from the top wall. Preferably, the hydrogen-permeable member 31 is formed from a material which satisfies the relation $B \geq 50A$, where A is water-vapor permeability of the material, and B is hydrogen permeability of the material. Desirably, the hydrogen-permeable member 31 is formed from a material which satisfies the relation $B \geq 100A$. Specifically, the hydrogen-permeable member 31 is preferably formed from a single material selected from the group consisting of, for example, ethylene-propylene rubber, butyl rubber, fluorine-containing rubber, nitrile-butadiene rubber, and silicone rubber. The number of the hydrogen-permeable members 31 can be changed as appropriate. An outward flange 26a around the expanded portion 27 of the tank body 26 is brazed to the bottom plate 28 by utilization of the above-mentioned brazing material layer such that the hydrogen-permeable member 31 is located immediately above the through-hole 22. The shape of the sheet used to form the tank body 26 is not limited to circle, and the shape of the expanded portion 27 is not limited to a truncated cone.

The bottom plate 28 assumes a rectangular shape elongated in the front-rear direction and is formed from an aluminum brazing sheet having a brazing material layer on its lower side. The bottom plate 28 is brazed to the upper metal plate 3 of the heat radiation base 2 by utilization of the brazing material layer. The bottom plate 28 has a circular communication hole 32, which is greater than the communication hole 22 of the upper metal plate 3 and is formed at a portion corresponding to the communication hole 22 concentrically with the communication hole 22 so as to communicate with the communication hole 22. The shape of the communication hole 32 is not limited to circle. A baffle 33 which is inclined radially inward with respect to the upward direction is integrally formed along the entire circumference of the communication hole 32 of the bottom plate 28. An upper end of the baffle 33 defines an opening 34. The expansion tank 7 has such a structure as to be able to receive and retain air contained in the form of bubbles in the cooling liquid and to receive the cooling liquid when the cooling liquid is expanded through application of heat, in order to prevent breakage of the cooling-liquid channel 5, which could otherwise result from increase in pressure in the cooling-liquid channel 5. Also, by means of containing excess cooling liquid in the expansion tank 7, a deterioration in cooling efficiency can be prevented at the time of reduction in the cooling liquid.

As shown in FIG. 3, a communication member 35 is mounted on the upper surface of the heat radiation base 2 for establishing communication between the two communication holes 23, which open respective end portions of the second downwardly expanded portions 18 of the first subsection 12 of the channel formation section 11 at the upper side of the heat radiation base 2. The communication member 35 includes a body 36, which expands upward and opens downward, and an outward flange 37, which is integrally formed around the opening of the body 36. The outward flange 37 is fixed to the heat radiation base 2 by means of screws 38 (joint members). A region between the outward flange 37 and the outer surface of the upper metal plate 3 serves as a communication section 39 for establishing communication between the interior and the exterior of the cooling-liquid channel 5. A sheet-like hydrogen-permeable member 41 is disposed in the communication section 39. The hydrogen-permeable member 41 seals the communication section 39. The hydrogen-permeable member 41 is formed from a material similar to that used to form the above-mentioned hydrogen-permeable member 31.

The dimensions of the hydrogen-permeable members 31, 41 along the hydrogen permeation direction (along the vertical direction for the hydrogen-permeable member 31 and along the width direction for the hydrogen-permeable member 41) and the areas of the sections of the hydrogen-permeable members 31, 41 taken perpendicular to the hydrogen permeation direction (along the horizontal direction for the hydrogen-permeable member 31 and along the vertical direction for the hydrogen-permeable member 41) are determined such that the total hydrogen permeation speed of the hydrogen-permeable members 31, 41 is 0.1 cc/h or higher per an inner surface area of 1 $mm^2$ of the cooling-liquid channel 5. The total hydrogen permeation speed of the hydrogen-permeable members 31, 41 is determined to be 0.1 cc/h or higher per an inner surface area of 1 $mm^2$ of the cooling-liquid channel 5 for the following reason: experiments have revealed that, under the condition, hydrogen generated in the cooling-liquid channel 5 can be efficiently released to the exterior of the cooling-liquid channel 5. If either one of the two hydrogen-permeable members exhibits a hydrogen permeation speed of 0.1 cc/h or higher per an inner surface area of 1 $mm^2$ of the cooling-liquid channel 5, the other hydrogen-permeable member is not indispensable. When the hydrogen-permeable member 31 is unnecessary, as a matter of course, the through-hole 29 of the tank body 26 of the expansion tank 7 becomes unnecessary. When the hydrogen-permeable member 41 is unnecessary, as a matter of course, the communication member 35, the second disconnected portion 15, and the second downwardly expanded portions 18 are unnecessary, and the formation of an upwardly expanded portion of the upper metal plate 3 will suffice.

The heat-receiving region 8 is provided on the lower surface of the lower metal plate 4 at a position corresponding to a central portion of one of the two second subsections 13 of the channel formation section 11 of the upper metal plate 3. A corrugated heat radiation fin 42 of aluminum is brazed to the lower surface of the lower metal plate 4 in such a manner as to encompass a portion of the first subsection 12 of the channel formation section 11 of the upper metal plate 3. Hereby, the heat-radiating region 9 is provided on the lower surface of the heat radiation base 2 in such a manner as to encompass a portion of the cooling-liquid channel 5.

For example, in a notebook-size personal computer composed of a personal-computer body section having a keyboard, and a display unit which is provided on the personal-computer body section such that it can be opened and closed, the liquid-cooled heat radiator 1 is disposed within the housing of the personal-computer body section, and a CPU C (heat-generating electronic component) is thermally brought in contact with the lower surface of the heat radiation base 2 in the heat-receiving region 8 of the cooling-liquid channel 5 of the liquid-cooled heat radiator 1. When the notebook-size personal computer is started, the circulation pump 6 circulates the cooling liquid through the cooling-liquid channel 5. Heat generated from the CPU C is transmitted to the cooling liquid via the lower metal plate 4. While the cooling liquid is circulating through the cooling-liquid channel 5 on its way to the heat-receiving region 8, heat of the cooling liquid is radiated to the exterior of the cooling-liquid channel 5 via the upper and lower metal plates 3, 4, particularly, via the lower metal plate 4 and the heat radiation fin 42 in the heat-radiating region 9. As a result, the cooling liquid is cooled. This operation is repeated, whereby heat generated from the CPU C is radiated.

In electronic equipment, other than a notebook-size personal computer, having a housing and a heat-generating electronic component disposed in the housing, the liquid-cooled heat radiator 1 may be disposed within the housing, and the heat-generating electronic component may be thermally brought in contact with the heat-receiving region 8 of the heat radiation base 2.

Figure 4:
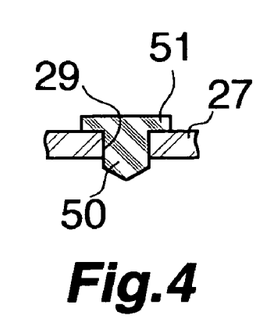
[FIG. 4] Enlarged fragmentary vertical sectional view showing a modified hydrogen-permeable member fixedly fitted into a through-hole formed in a top wall of a tank body of the expansion tank in the first embodiment.
Figure 5:
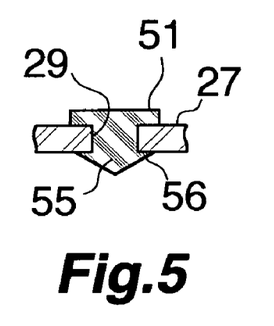
[FIG. 5] Enlarged fragmentary vertical sectional view showing a modified hydrogen-permeable member fixedly fitted into the through-hole formed in the top wall of the tank body of the expansion tank in the first embodiment.

FIGS. 4 and 5 show modified hydrogen-permeable members fixedly fitted into the through-hole 29 formed in the top wall of the tank body 26 of the expansion tank 7.

A hydrogen-permeable member 50 shown in FIG. 4 assumes the form of a pin, and an inner end portion of the hydrogen-permeable member 50 projects into the interior of the expanded portion 27 of the tank body 26. The hydrogen-permeable member 50 has an engagement portion 51 formed integrally with an outer end portion of the hydrogen-permeable member 50 and adapted to be engaged with a peripheral region around the through-hole 29 of the outer surface of the top wall of the expanded portion 27. The hydrogen-permeable member 50 seals the through-hole 29.

A hydrogen-permeable member 55 shown in FIG. 5 assumes the form of a pin, and an inner end portion of the hydrogen-permeable member 55 projects into the interior of the expanded portion 27 of the tank body 26. The hydrogen-permeable member 55 has the engagement portion 51 formed integrally with an outer end portion of the hydrogen-permeable member 55 and adapted to be engaged with a peripheral region around the through-hole 29 of the outer surface of the top wall of the expanded portion 27 as well as an engagement portion 56 formed integrally with a portion of the hydrogen-permeable member 55 projecting into the interior of the expanded portion 27, and adapted to be engaged with a peripheral region around the through-hole 29 of the inner surface of the top wall of the expanded portion 27. The hydrogen-permeable member 50 seals the through-hole 29.

Figure 6:
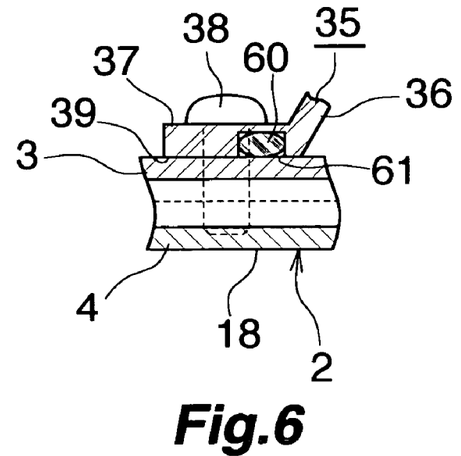
[FIG. 6] Enlarged fragmentary vertical sectional view showing a modified hydrogen-permeable member disposed in a communication section located between an outward flange of the communication member and a heat radiation base in the first embodiment.

FIG. 6 shows a modified hydrogen-permeable member disposed in the communication section 39 located between the outward flange 37 of the communication member 35 and the heat radiation base 2.

The hydrogen-permeable member 60 shown in FIG. 6 assumes the form of an O-ring and is fitted into an annular groove 61, which is formed in the lower surface of the outward flange 37 of the communication member 35 along the entire circumference of the outward flange 37. The hydrogen-permeable member 60 seals the communication section 39.

The hydrogen-permeable members 50, 55, 60 shown in FIGS. 4 to 6 are also formed from a material similar to that used to form the aforementioned hydrogen-permeable member 31. The dimensions of the hydrogen-permeable members 50, 55, 60 along the hydrogen permeation direction (along the vertical direction for the hydrogen-permeable members 50, 55 and along the radial direction for the hydrogen-permeable member 60) and the areas of the sections of the hydrogen-permeable members 50, 55, 60 taken perpendicular to the hydrogen permeation direction (along the horizontal direction for the hydrogen-permeable members 50, 55 and along the circumferential direction for the hydrogen-permeable member 60) are determined as in the case of the aforementioned hydrogen-permeable members 31, 41.

Figure 7:
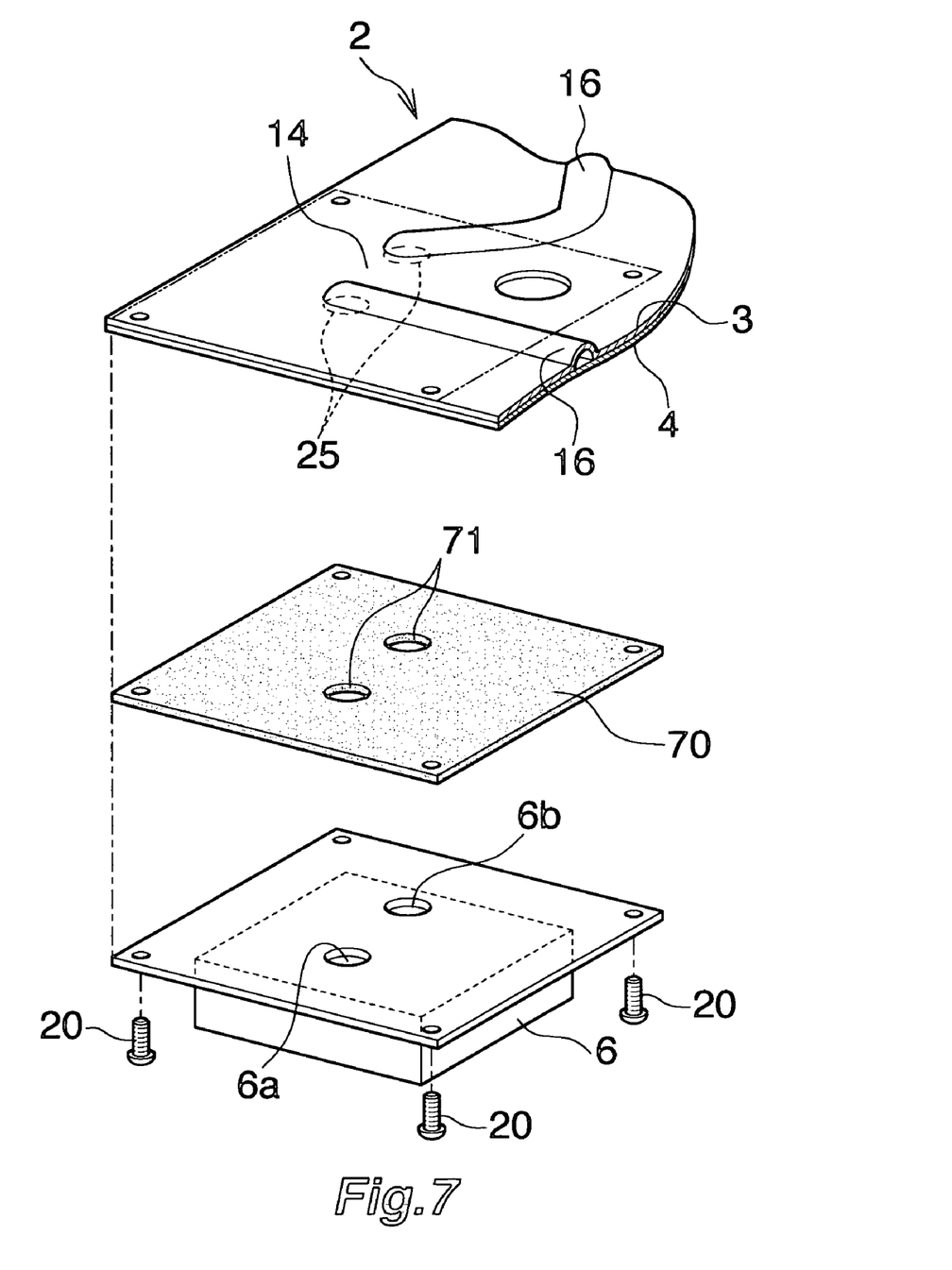
[FIG. 7] Exploded perspective view showing a portion of a second embodiment of the liquid-cooled heat radiator according to the present invention.

FIG. 7 shows a second embodiment of the liquid-cooled heat radiator according to the present invention.

In FIG. 7, a region between the upper surface of the circulation pump 6 and the lower surface of the heat radiation base 2 serves as the communication section for establishing communication between the interior and the exterior of the cooling-liquid channel 5. A sheet-like hydrogen-permeable member 70 is disposed in the communication section; i.e., between the upper surface of the circulation pump 6 except the discharge port 6a and the suction port 6b and a corresponding lower surface of the heat radiation base 2 except the through-holes 25. The hydrogen-permeable member 70 has two communication holes 71 for establishing communication between the discharge hole 6a and the corresponding through-hole 25 and communication between the suction port 6b and the corresponding through-hole 25. The hydrogen-permeable member 70 is formed from a material similar to that used to form the hydrogen-permeable member 31 in the liquid-cooled heat radiator of the first embodiment. The communication section located between the upper surface of the circulation pump 6 and the lower surface of the heat radiation base 2 is sealed by the hydrogen-permeable member 70.

In the case where the hydrogen-permeable member 70 is provided in addition to the hydrogen-permeable members 31, 41 in the liquid-cooled heat radiator of the first embodiment, the dimension of the hydrogen-permeable member 70 along the hydrogen permeation direction (the distance between the communication hole 71 and a peripheral edge) and the area of the section of the hydrogen-permeable member 70 taken perpendicular to the hydrogen permeation direction (along the vertical direction) are determined such that the total hydrogen permeation speed of the three hydrogen-permeable members 31, 41, 70 is 0.1 cc/h or higher per an inner surface area of 1 $mm^2$ of the cooling-liquid channel 5.

In some cases, no hydrogen-permeable member is disposed in the top wall of the expansion tank 7 and between the communication member 35 and the heat radiation base 2, and the hydrogen-permeable member 70 is only disposed in the communication section located between the circulation pump 6 and the heat radiation base 2. In such cases, the dimension of the hydrogen-permeable member 70 along the hydrogen permeation direction (the distance between the communication hole 71 and a peripheral edge) and the area of the section of the hydrogen-permeable member 70 taken perpendicular to the hydrogen permeation direction (along the vertical direction) are determined such that the hydrogen-permeable member 70 exhibits, by itself, a hydrogen permeation speed of 0.1 cc/h or higher per an inner surface area of 1 $mm^2$ of the cooling-liquid channel 5.

Figure 8:
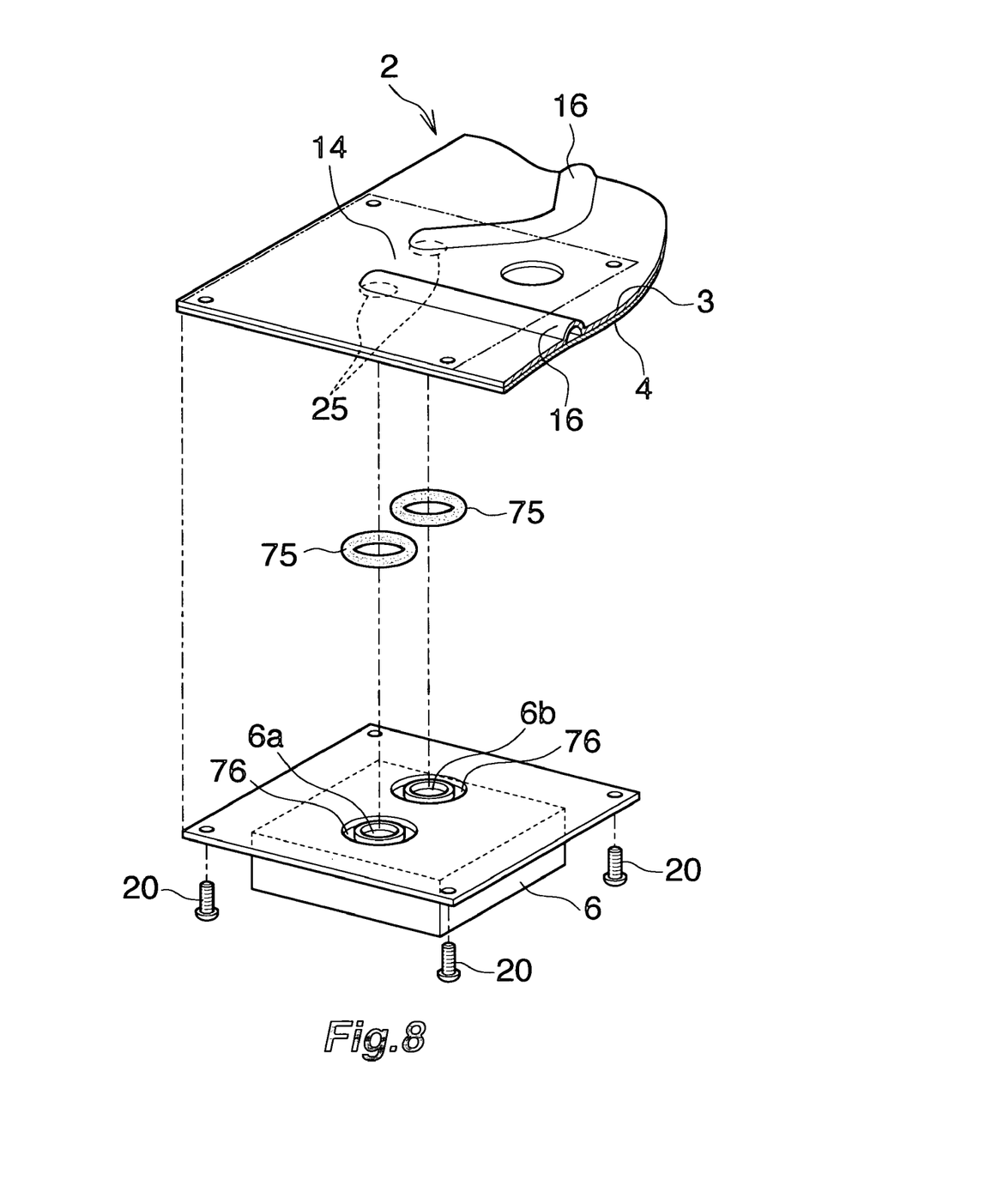
[FIG. 8] Exploded perspective view, equivalent to FIG. 7, showing a modified hydrogen-permeable member disposed in a communication section located between the upper surface of a circulation pump and the lower surface of a heat radiation base in the second embodiment.

FIG. 8 shows a modified hydrogen-permeable member disposed in the communication section located between the upper surface of the circulation pump 6 and the lower surface of the heat radiation base 2.

Hydrogen-permeable members 75 shown in FIG. 8 each assume the form of an O-ring and are fitted into corresponding annular grooves 76 formed in the upper surface of the circulation pump 6 around the discharge port 6a and the suction port 6b. The hydrogen-permeable members 75 are formed from a material similar to that used to form the hydrogen-permeable member 31 in the liquid-cooled heat radiator of the first embodiment. The communication section located between the upper surface of the circulation pump 6 and the lower surface of the heat radiation base 2 is sealed by the hydrogen-permeable members 75.

In the case where the hydrogen-permeable members 75 are provided in addition to the hydrogen-permeable members 31, 41 in the liquid-cooled heat radiator of the first embodiment, the dimension of each of the hydrogen-permeable members 75 along the hydrogen permeation direction (along the radial direction) and the area of the section of each of the hydrogen-permeable members 70 taken perpendicular to the hydrogen permeation direction (along the circumferential direction) are determined such that the total hydrogen permeation speed of the three hydrogen-permeable members 31, 41, 75 is 0.1 cc/h or higher per an inner surface area of 1 $mm^2$ of the cooling-liquid channel 5.

In some cases, no hydrogen-permeable member is disposed in the top wall of the expansion tank 7 and between the communication member 35 and the heat radiation base 2, and the hydrogen-permeable members 75 are only disposed in the communication section located between the circulation pump 6 and the heat radiation base 2. In such cases, the dimension of each of the hydrogen-permeable members 75 along the hydrogen permeation direction and the area of the section of each of the hydrogen-permeable members 75 taken perpendicular to the hydrogen permeation direction are determined such that the hydrogen-permeable members 75 exhibit, by themselves, a hydrogen permeation speed of 0.1 cc/h or higher per an inner surface area of 1 $mm^2$ of the cooling-liquid channel 5.

Figure 9:
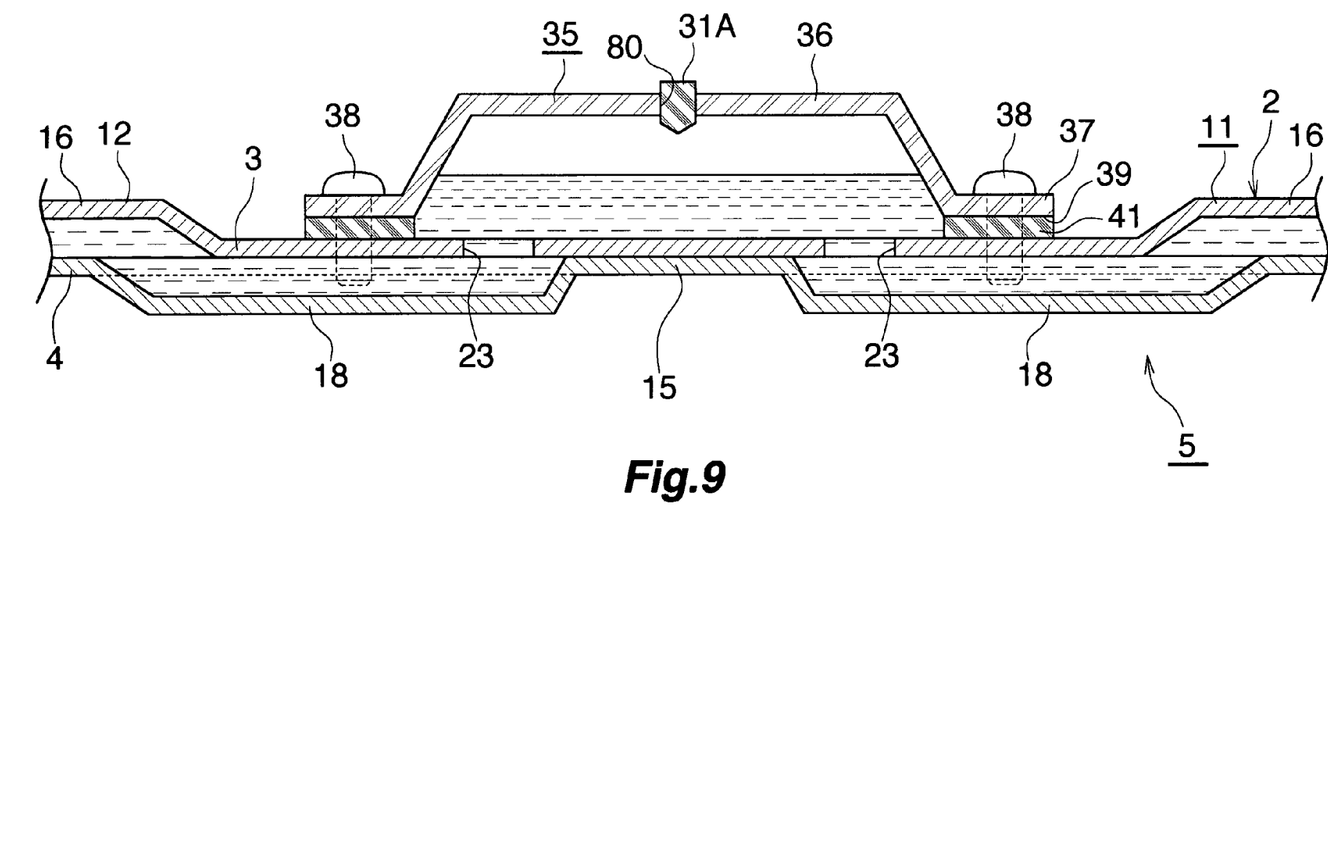
[FIG. 9] Sectional view, equivalent to FIG. 3, showing a portion of a third embodiment of the liquid-cooled heat radiator according to the present invention.

FIG. 9 shows a third embodiment of the liquid-cooled heat radiator according to the present invention.

In FIG. 9, a through-hole 80 is formed in the top wall of the body 36 of the communication member 35 and serves as the communication section for establishing communication between the interior and the exterior of the cooling-liquid channel 5. A pin-like hydrogen-permeable member 31A, which is identical with that fixedly fitted into the through-hole 29 of the tank body 26 of the expansion tank 7, is fixedly fitted into the through-hole 80. The number of the hydrogen-permeable members 31A can be changed as appropriate. In place of the hydrogen-permeable member 31A, the hydrogen-permeable member 50 shown in FIG. 4 or the hydrogen-permeable member 55 shown in FIG. 5 may be fixedly fitted into the through-hole 80.

In the case where the hydrogen-permeable member 31A is provided in the through-hole 80 of the body 36 of the communication member 35 in addition to the hydrogen-permeable members 31, 41 in the liquid-cooled heat radiator of the first embodiment, the dimension of the hydrogen-permeable member 31A along the hydrogen permeation direction (the length along the vertical direction) and the area of the section of the hydrogen-permeable member 31A taken perpendicular to the hydrogen permeation direction (along the horizontal direction) are determined such that the total hydrogen permeation speed of the three hydrogen-permeable members 31, 41, 31A is 0.1 cc/h or higher per an inner surface area of 1 mm$^2$ of the cooling-liquid channel 5.

INDUSTRIAL APPLICABILITY

The liquid-cooled heat radiator of the present invention is preferably used to radiate heat generated from a heat-generating body, such as a heat-generating electronic component of a piece of electronic equipment, such as a notebook-size personal computer, a two-dimensional display unit, or a projector.

The invention claimed is:

1. A liquid-cooled heat radiator comprising a heat radiation base having a cooling-liquid channel,
    wherein the heat radiation base has a communication section for establishing communication between the interior and the exterior of the cooling-liquid channel, and a hydrogen-permeable member is disposed in the communication section; and
    wherein an expansion tank is provided on the heat radiation base; the expansion tank has a tank body having an expanded portion, which expands upward and opens downward, and a bottom plate joined to a lower end of the tank body to thereby close a bottom opening of the expanded portion, and joined to an upper surface of the heat radiation base; the heat radiation base and the bottom plate have respective communication holes formed therein for establishing communication between the cooling-liquid channel and the interior of the tank body; the communication section is a through-hole formed in a top wall of the expanded portion of the tank body; and the hydrogen-permeable member is fixedly fitted into the through-hole so as to stop the through-hole.

2. A liquid-cooled heat radiator according to claim 1, wherein the hydrogen-permeable member assumes the form of a pin, and the hydrogen-permeable member has an engagement portion formed integrally with an outer end portion of the hydrogen-permeable member and adapted to be engaged with a peripheral region around the through-hole of an outer surface of the top wall of the tank body.

3. A liquid-cooled heat radiator according to claim 1, wherein an inner end portion of the hydrogen-permeable member projects into the interior of the tank body, and the hydrogen-permeable member has an engagement portion formed integrally with the inner end portion of the hydrogen-permeable member projecting into the interior of the tank body, and adapted to be engaged with a peripheral region around the through-hole of an inner surface of the top wall of the tank body.

4. A liquid-cooled heat radiator according to claim 1, wherein the heat radiation base is composed of two metal plates joined together in layers, and the cooling-liquid channel is formed between the two metal plates used to form the heat radiation base.

5. A liquid-cooled heat radiator according to claim 4, wherein the metal plates are aluminum plates and are brazed together in layers.

6. A liquid-cooled heat radiator according to claim 5, wherein the two aluminum plates are brazed together by utilization of a brazing material layer formed on at least one of the two aluminum plates on a side which faces the other aluminum plate.

7. A liquid-cooled heat radiator according to claim 4, wherein the cooling-liquid channel includes a channel formation section formed by outwardly expanding at least one of the two metal plates; the channel formation section includes a disconnected portion where the channel formation section is locally disconnected; two end portions of the channel formation section which terminate at the disconnected portion are formed by expanding one of the two metal plates with the other metal plate maintaining its outer surface flat; the other metal plate has two communication holes formed therein for allowing the two terminal portions terminating at the disconnected portion of the channel formation section to communicate with the exterior of the two terminal portions through the two communication holes, respectively; a communication member for establishing communication between the two communication holes is fixed to an outer surface of the other metal plate by means of joint members; the communication member includes a body which expands outward and opens toward the one of the two metal plates to thereby form an opening, and an outward flange formed integrally with a peripheral portion around the opening of the body; a region between the outward flange and an outer surface of the other metal plate serves as the communication section; and the hydrogen-permeable member in the form of a sheet is disposed in the communication section.

8. A liquid-cooled heat radiator according to claim 4, wherein the cooling-liquid channel includes a channel formation section formed by outwardly expanding at least one of the two metal plates; the channel formation section includes a disconnected portion where the channel formation section is locally disconnected; two end portions of the channel formation section which terminate at the disconnected portion are formed by expanding one of the two metal plates with the other metal plate maintaining its outer surface flat; the other metal plate has two communication holes formed therein for allowing the two terminal portions terminating at the disconnected portion of the channel formation section to communicate with the exterior of the two terminal portions through the two communication holes, respectively; a communication member for establishing communication between the two communication holes is fixed to an outer surface of the other metal plate by means of joint members; the communication member includes a body which expands outward and opens toward the one of the two metal plates to thereby form an opening, and an outward flange formed integrally with a peripheral portion around the opening of the body; a region between the outward flange and an outer surface of the other metal plate serves as the communication section; and the hydrogen-permeable member in the form of an O-ring is disposed in the communication section.

9. A liquid-cooled heat radiator according to claim 7, wherein a through-hole is formed in a top wall of the body of the communication member; the through-hole also serves as the communication section; and the hydrogen-permeable member is fixedly fitted into the through-hole so as to stop the through-hole.

10. A liquid-cooled heat radiator according to claim 1, wherein a pump for circulating a cooling liquid through the cooling-liquid channel is mounted on the heat radiation base.

11. A liquid-cooled heat radiator comprising a heat radiation base having a cooling-liquid channel,
wherein the heat radiation base has a communication section for establishing communication between the interior and the exterior of the cooling-liquid channel, and a hydrogen-permeable member is disposed in the communication section;
wherein the heat radiation base is composed of two metal plates joined together in layers, and the cooling-liquid channel is formed between the two metal plates used to form the heat radiation base; and
wherein the cooling-liquid channel includes a channel formation section formed by outwardly expanding at least one of the two metal plates; the channel formation section includes a disconnected portion where the channel formation section is locally disconnected; two end portions of the channel formation section which terminate at the disconnected portion are formed by expanding one of the two metal plates with the other metal plate maintaining its outer surface flat; the other metal plate has two through-holes formed therein for allowing the two terminal portions terminating at the disconnected portion of the channel formation section to communicate with the exterior of the two terminal portions through the two through-holes, respectively; a pump having a discharge port and a suction port and adapted to circulate a cooling liquid through the cooling-liquid channel is mounted on an outer surface of the other metal plate; the discharge port of the pump is connected to one of the two through-holes formed in the other metal plate, and the suction port of the pump is connected to the other through-hole; a region between the pump and the outer surface of the other metal plate serves as the communication section; and the hydrogen-permeable member in the form of a sheet is disposed in the communication section.

12. A liquid-cooled heat radiator according to claim 4, wherein the cooling-liquid channel includes a channel formation section formed by outwardly expanding at least one of the two metal plates; the channel formation section includes a disconnected portion where the channel formation section is locally disconnected; two end portions of the channel formation section which terminate at the disconnected portion are formed by expanding one of the two metal plates with the other metal plate maintaining its outer surface flat; the other metal plate has two through-holes formed therein for allowing the two terminal portions terminating at the disconnected portion of the channel formation section to communicate with the exterior of the two terminal portions through the two through-holes, respectively; a pump having a discharge port and a suction port and adapted to circulate a cooling liquid through the cooling-liquid channel is mounted on an outer surface of the other metal plate; the discharge port of the pump is connected to one of the two through-holes formed in the other metal plate, and the suction port of the pump is connected to the other through-hole; a region between the pump and the outer surface of the other metal plate serves as the communication section; and the hydrogen-permeable member in the form of an O-ring is disposed around each of the discharge port and the suction port in the communication section.

13. A liquid-cooled heat radiator according to claim 1, wherein the heat radiation base has, on its one side, a heat-receiving region with which a heat-generating element is thermally brought in contact.

14. A piece of electronic equipment comprising a housing and a heat-generating electronic component disposed within the housing, wherein the liquid-cooled heat radiator according to claim 13 is disposed within the housing, and the heat-generating electronic component is thermally brought in contact with the heat-receiving region of the heat radiation base.

15. A notebook-size personal computer comprising a body section having a keyboard, and a display unit which is provided on the body section such that it can be opened and closed, wherein the liquid-cooled heat radiator according to claim 13 is disposed within a housing of the body section, and a CPU disposed within the housing of the body section is thermally brought in contact with the heat-receiving region of the heat radiation base.

16. A liquid-cooled heat radiator according to claim 2, wherein an inner end portion of the hydrogen-permeable member projects into the interior of the tank body, and the hydrogen-permeable member has an engagement portion formed integrally with the inner end portion of the hydrogen-permeable member projecting into the interior of the tank body, and adapted to be engaged with a peripheral region around the through-hole of an inner surface of the top wall of the tank body.

17. A liquid-cooled heat radiator according to claim 1, wherein the hydrogen-permeable member satisfies a relation B≧50A, where A is water-vapor permeability of the hydrogen-permeable member, and B is hydrogen permeability of the hydrogen-permeable member.

18. A liquid-cooled heat radiator according to claim 1, wherein the hydrogen-permeable member is formed from a single material selected from the group consisting of ethylene-propylene rubber, butyl rubber, fluorine-containing rubber, nitrile-butadiene rubber, and silicone rubber.

19. A liquid-cooled heat radiator according to claim 1, wherein the dimension of the hydrogen-permeable member along a hydrogen permeation direction and the area of a section of the hydrogen-permeable member taken perpendicular to the hydrogen permeation direction are determined such that a hydrogen permeation speed of the hydrogen-permeable member is 0.1 cc/h or higher per an inner surface area of 1 $mm^2$ of the cooling-liquid channel.

* * * * *